United States Patent
Segawa et al.

(10) Patent No.: US 12,353,123 B2
(45) Date of Patent: Jul. 8, 2025

(54) SEMICONDUCTOR MANUFACTURING APPARATUS AND SEMICONDUCTOR MANUFACTURING METHOD THEREOF

(71) Applicant: Winbond Electronics Corp., Taichung (TW)

(72) Inventors: Kazuhiro Segawa, Taichung (TW); Isao Tanaka, Taichung (TW)

(73) Assignee: Winbond Electronics Corp., Taichung (TW)

( * ) Notice: Subject to any disclaimer, the term of this patent is extended or adjusted under 35 U.S.C. 154(b) by 717 days.

(21) Appl. No.: 17/750,408

(22) Filed: May 23, 2022

(65) Prior Publication Data

US 2023/0375914 A1 Nov. 23, 2023

(51) Int. Cl.
*G03F 1/42* (2012.01)
*G03F 1/36* (2012.01)

(52) U.S. Cl.
CPC .... *G03F 1/42* (2013.01); *G03F 1/36* (2013.01)

(58) Field of Classification Search
CPC ................................... G03F 1/42; G03F 1/36
See application file for complete search history.

(56) References Cited

U.S. PATENT DOCUMENTS

| | | | |
|---|---|---|---|
| 6,643,557 B1 | 11/2003 | Miller et al. | |
| 6,737,208 B1 | 5/2004 | Bode et al. | |
| 7,480,028 B2* | 1/2009 | Van Der Veen | G03F 7/70425 355/53 |
| 11,054,813 B2 | 7/2021 | Ypma et al. | |
| 11,307,507 B2* | 4/2022 | Van Hoof | G03F 7/70683 |
| 11,774,862 B2* | 10/2023 | Cekli | G03F 7/70633 356/399 |
| 2019/0257647 A1 | 8/2019 | Ichinose et al. | |

FOREIGN PATENT DOCUMENTS

| | | |
|---|---|---|
| JP | H07295230 | 11/1995 |
| JP | 2019531506 | 10/2019 |
| KR | 100791681 | 1/2008 |
| KR | 20080097994 | 11/2008 |
| KR | 20130061045 | 6/2013 |

OTHER PUBLICATIONS

"Office Action of Korea Counterpart Application", issued on Aug. 6, 2024, with English translation thereof, p. 1-p. 15.

* cited by examiner

*Primary Examiner* — Hung V Nguyen
(74) *Attorney, Agent, or Firm* — JCIPRNET

(57) ABSTRACT

A semiconductor manufacturing apparatus and a semiconductor manufacturing method thereof are provided. Wafers are grouped into a first wafer group and a second wafer group according to alignment mark position errors of the wafers and a first threshold value. The alignment mark position errors of the first wafer group are greater than the first threshold value, and the alignment mark position errors of the second wafer group are less than or equal to the first threshold value. A feedforward position correction value is calculated according to a difference between the alignment mark position errors of the first wafer group and a reference error value. A lithography process is performed on the wafers according to the feedforward position correction value.

12 Claims, 5 Drawing Sheets

SEMICONDUCTOR MANUFACTURING APPARATUS AND SEMICONDUCTOR MANUFACTURING METHOD THEREOF

BACKGROUND

Technical Field

The disclosure relates to a manufacturing apparatus, and more particularly, to a semiconductor manufacturing method of a semiconductor manufacturing apparatus.

Description of Related Art

During a semiconductor manufacturing process, alignment marks may be formed on wafers to check the alignment between front and back layers. Generally speaking, positions of the alignment marks on the wafers may be measured by a measurement apparatus before a lithography process is performed, and a position correction amount obtained according to a measurement result is fed forward to a lithography apparatus. The lithography apparatus may perform lithography position compensation according to the position correction, so as to control an overlay error within an acceptable range. However, advanced process control (APC) noises caused by differences in the device performance or structure between the measurement apparatus and the lithography apparatus (such as a case where manufacturers of the measurement apparatus and the lithography apparatus are different) will cause difficulties in controlling the overlay error, thereby affecting a yield rate and productivity of the semiconductor manufacturing process.

SUMMARY

The disclosure provides a semiconductor manufacturing method of a semiconductor manufacturing apparatus, which may effectively improve overlay error control, thereby enhancing a yield rate and productivity of a semiconductor manufacturing process.

A semiconductor manufacturing apparatus in the disclosure includes a lithography apparatus, a measurement apparatus, and a processor. The measurement apparatus measures alignment mark position errors of multiple wafers. The processor is coupled to the lithography apparatus and the measurement apparatus, groups the wafers into a first wafer group and a second wafer group according to the alignment mark position errors of the wafers and a first threshold value, calculates a feedforward position correction value according to a difference between the alignment mark position errors of the first wafer group and a reference error value, and controls the lithography apparatus to perform a lithography process according to the feedforward position correction value. The alignment mark position errors of the first wafer group are greater than the first threshold value, and the alignment mark position errors of the second wafer group are less than or equal to the first threshold value.

A semiconductor manufacturing method of a semiconductor manufacturing apparatus in the disclosure is further provided, including the following steps. Alignment mark position errors of multiple wafers are measured. The wafers are grouped into a first wafer group and a second wafer group according to the alignment mark position errors of the wafers and a first threshold value. The alignment mark position errors of the first wafer group are greater than the first threshold value, and the alignment mark position errors of the second wafer group are less than or equal to the first threshold value. A feedforward position correction value is calculated according to a difference between the alignment mark position errors of the first wafer group and a reference error value. A lithography process is performed according to the feedforward position correction value.

Based on the above, in the embodiments of the disclosure, the alignment mark positions of the wafers may be measured; the wafers are grouped into the first wafer group and the second wafer group according to the alignment mark position errors of the wafers and the first threshold value; the feedforward position correction value is calculated according to the difference between the alignment mark position errors of the first wafer group and the reference error value, and the lithography apparatus is controlled to perform the lithography process according to the feedforward position correction value. In this way, the lithography apparatus is controlled to perform the lithography process according to the feedforward position correction value obtained by calculating the difference between the alignment mark position errors of the first wafer group and the reference error value, instead of directly performing the lithography process according to the measured alignment mark position errors as in the conventional technology, which may effectively reduce APC noises caused by differences (such as a difference in wafer chucks) in the device performance or structure between the measurement apparatus and the lithography apparatus, and may improve overlay error control to enhance the yield rate and productivity of the semiconductor manufacturing process.

DETAILED DESCRIPTION OF DISCLOSED EMBODIMENTS

Figure 1:
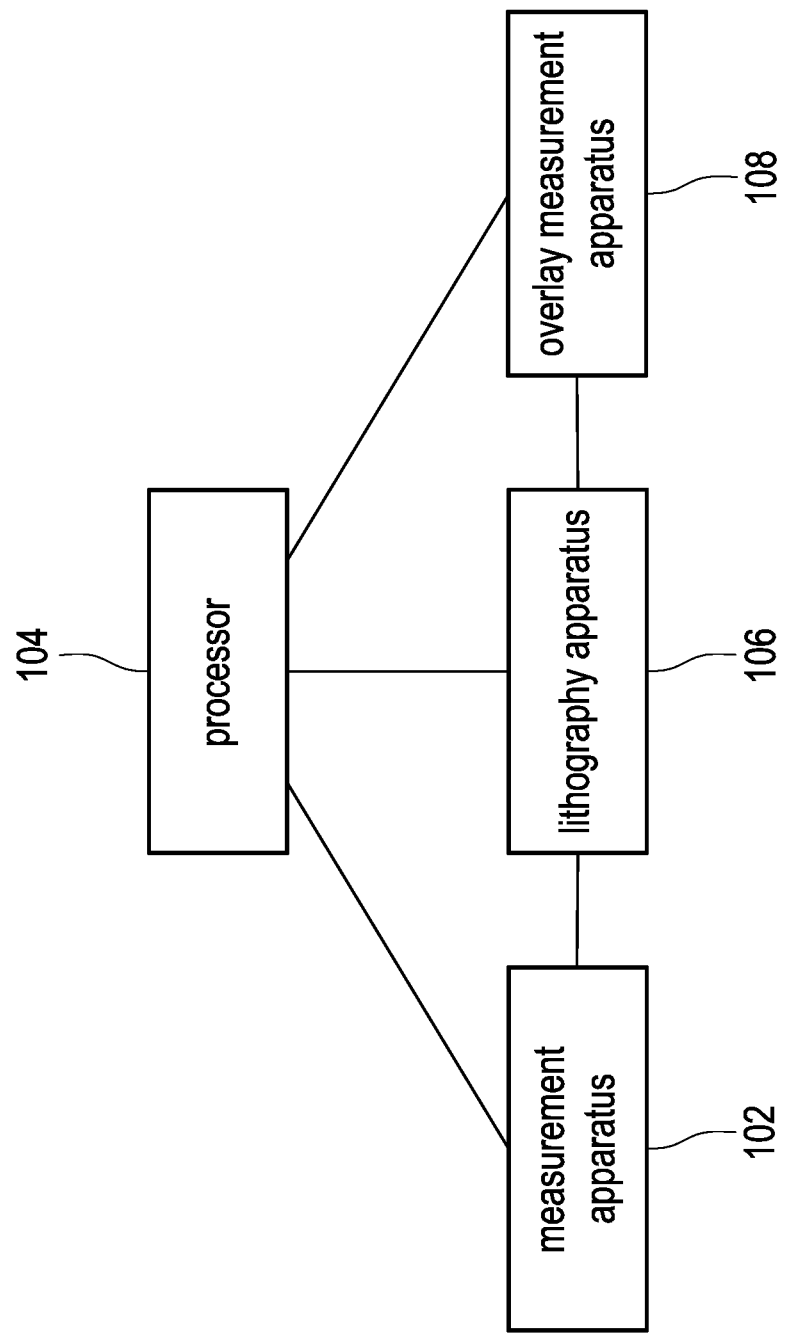
FIG. 1 is a schematic view of a semiconductor manufacturing apparatus according to an embodiment of the disclosure.

In order for the content of the disclosure to be more comprehensible, embodiments are described below as examples by which the disclosure may indeed be implemented. In addition, wherever possible, elements/components/steps with the same reference numerals in the drawings and embodiments represent the same or similar parts.

Hereinafter, referring to FIG. 1, FIG. 1 is a schematic view of a semiconductor manufacturing apparatus according to an embodiment of the disclosure. The semiconductor manufacturing apparatus may include a measurement apparatus 102, a processor 104, a lithography apparatus 106, and an overlay measurement apparatus 108. The processor 104 is coupled to the measurement apparatus 102, the lithography apparatus 106, and the overlay measurement apparatus 108. The measurement apparatus 102 may be, for example, a stand-alone pre-aligner, but the disclosure is not limited thereto. The measurement apparatus 102 may measure shifts between alignment marks and standard positions on wafers to obtain alignment mark position errors. The lithography apparatus 106 is configured to perform a lithography process on the wafers. The lithography apparatus 106 may be, for example, a scanning exposure machine, but the disclosure is not limited thereto.

Figure 2:
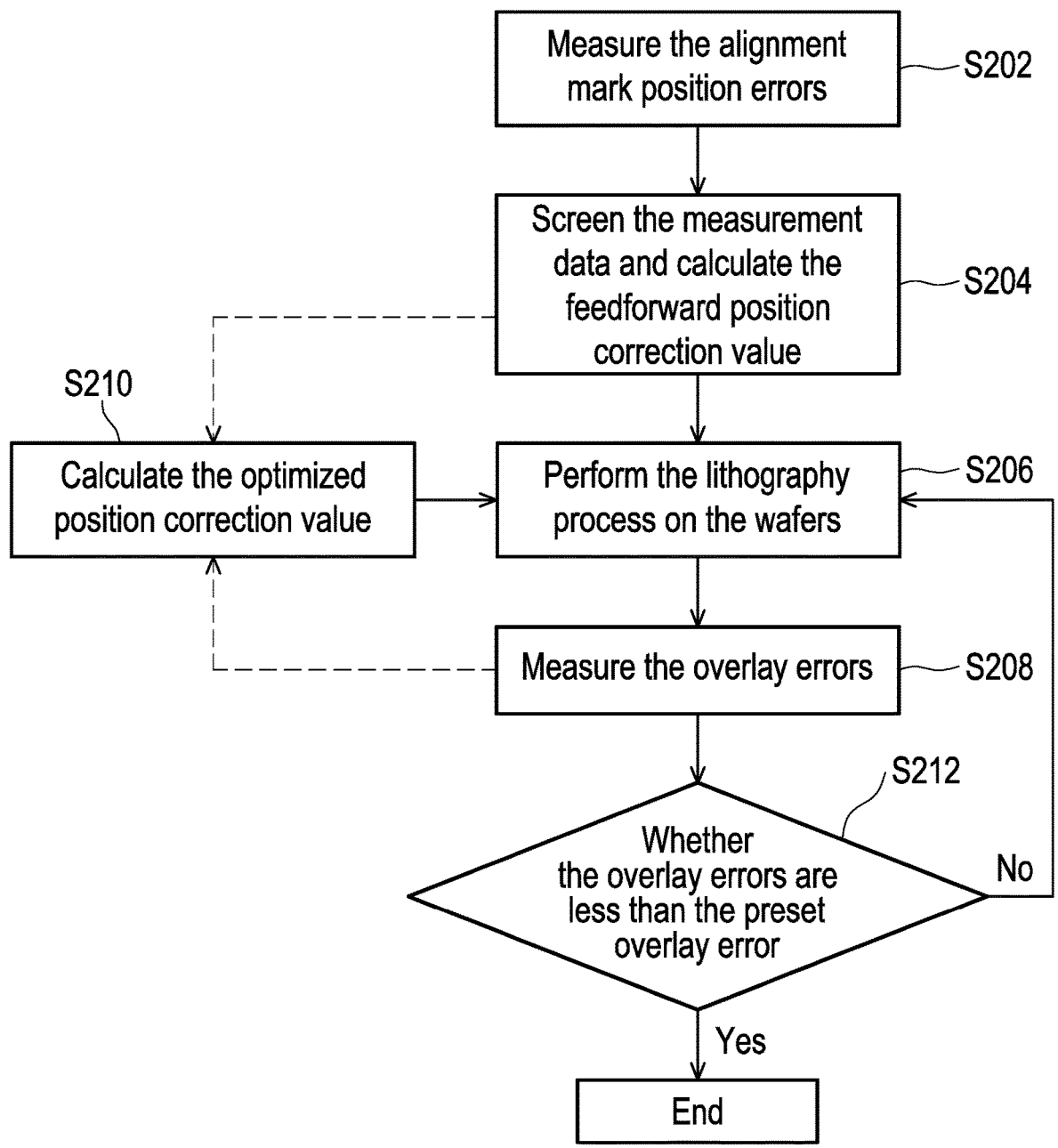
FIG. 2 is a flowchart of a semiconductor manufacturing method of a semiconductor manufacturing apparatus according to an embodiment of the disclosure.

As shown in FIG. 2, the processor 104 may control the measurement apparatus 102 to measure the alignment mark position errors on the wafers (step S202), then screen measurement data for calculating a feedforward position correction value according to a measurement result of the measurement apparatus 102, for example, may eliminate the measurement data with too large alignment mark position errors (for example, may eliminate the measurement data with the alignment mark position errors greater than a preset critical value), and calculate the feedforward position correction value according to the screened measurement data (step S204). The processor 104 may then control the lithography apparatus 106 to perform the lithography process on the wafers (step S206), and control the overlay measurement apparatus 108 to measure overlay errors of the wafers (step S208). The lithography process may include, for example, steps such as coating a photoresist, exposing, and developing, but the disclosure is not limited thereto. In addition, the processor 104 may further perform the lithography process according to an optimized position correction value generated in step S210. In step S210, the optimized position correction value may be generated according to the feedforward position correction value generated in step S204 and a feedback value from step S208 (which is the overlay errors obtained by the overlay measurement apparatus 108 measuring the wafers). In step S212, it may be determined whether the overlay errors measured in step S208 are less than a preset overlay error. If the overlay errors are less than the preset overlay error, the steps proceeds with the end step. If the overlay errors are not less than the preset overlay error, the steps returns back to step S206 to perform reworking until the overlay errors are less than the preset overlay error.

Figure 3:
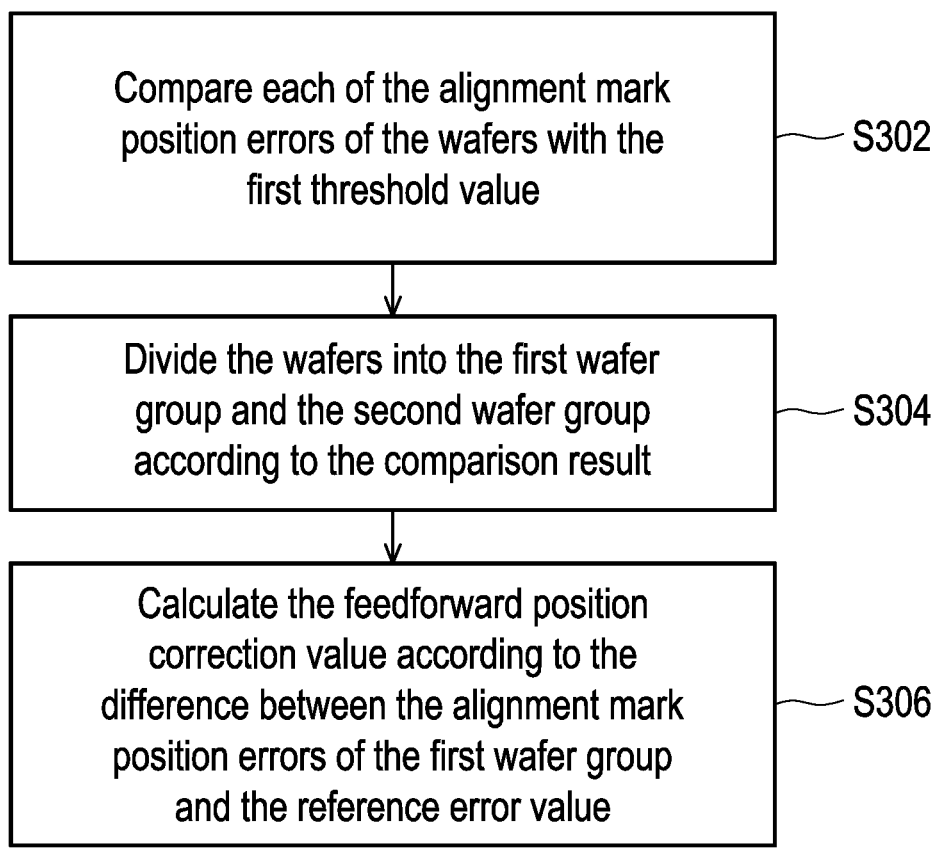
FIG. 3 is a flowchart of a method for generating a feedforward position correction value according to an embodiment of the disclosure.

Further, implementation details of step S204 may be as shown in FIG. 3, for example. The processor 104 may group the wafers according to the alignment mark position errors of the wafers measured by the measurement apparatus 102, for example, compare each of the alignment mark position errors of the wafers with a first threshold value (step S302), divide the wafers with the alignment mark position errors greater than the first threshold value into a first wafer group, and divide the wafers with the alignment mark position errors not greater than the first threshold value into a second wafer group (step S304). Then, the processor 104 calculates the feedforward position correction value according to a difference between the alignment mark position errors of the first wafer group and a reference error value (step S306).

An approximate calculation may be performed for the alignment mark position errors of the wafers, for example, using a model formula formed by polynomials. The processor 104 may use statistical operations such as a least square method to obtain a coefficient of the model formula indicating a relationship between position coordinates and alignment mark position coordinate errors according to the measured alignment mark position errors. The model formula of the alignment mark position errors may be represented by the following formulas, for example.

$$MX = wk1 + wk3*wx + wk5*wy + wk7*wx^2 + wk9*wx*wy + wk11*wy^2 + wk13*wx^3 + wk15*wx^2*wy + wk17*wx*wy^2 + wk19*wy^3 + sk3*fx + sk5*fy \quad (1)$$

$$MY = wk2 + wk4*wy + wk6*wx + wk8*wy^2 + wk10*wy*wx + wk12*wx^2 + wk14*wy^3 + wk16*wy^2*wx + wk18*wy*wx^2 + wk20*wx^3 + sk4*fy + sk6*fx \quad (2)$$

MX and MY are errors in an X-axis direction and a Y-axis direction of a coordinate system centered on an origin of the wafer; wx and wy are position coordinates of the coordinate system centered on the origin of the wafer, and fx and fy are the position coordinates of the coordinate system centered on an origin of a shot area. Coefficients wk1 to wk20 and sk1 to sk6 may be calculated, for example, by the least square method according to a difference between alignment mark positions on the wafers measured by the measurement apparatus 102 and designed standard alignment mark positions. However, the disclosure is not limited thereto. In some embodiments, the coefficients wk1 to wk20 and sk1 to sk6 may also be obtained by calculating a mean value, a median value, a maximum value, a minimum value, 3Sigma, and M 3Sigma, etc. The above first threshold value may, for example, include multiple threshold values corresponding to the coefficients wk1 to wk20 and sk1 to sk6. For example, when any one of the coefficients wk1 to wk20 and sk1 to sk6 is greater than the corresponding threshold value, the wafers are divided into the first wafer group, otherwise the wafers are divided into the second wafer group.

In addition, the reference error value may be obtained, for example, according to the alignment mark position errors of the wafers in the second wafer group, for example, by calculating a mean value of the alignment mark position errors of the wafers in the second wafer group as the reference error value, and for example, by calculating a mean value of the coefficient wk1 of each of the alignment mark position errors of the wafers in the second wafer group. Mean values of the rest of coefficients wk2 to wk20 and sk1 to sk6 are also calculated in the same way, and the mean value of each of the coefficients is used as the coefficients of the model formula formed by the polynomials, so as to obtain the reference error value represented by the model formula formed by the polynomials. However, the disclosure is not limited thereto. A median value of the alignment mark position errors of the wafers in the second wafer group may also be calculated as the reference error value. For example, a median value of each of the coefficients of the alignment mark position errors of the wafers in the second wafer group may be used as the coefficients of the model formula formed by the polynomials, so as to obtain the reference error value represented by the model formula formed by the polynomials. In some embodiments, the reference error value may also be set according to historical data, which, for example, may be obtained according to the alignment mark position errors of the wafers in which the alignment mark position errors are less than or equal to the first threshold value in the previous lot of wafers. For example, the mean value of the alignment mark position errors of the wafers in the second wafer group in the previous N lots of wafers may be used as the reference error value, where N is a positive integer.

After the feedforward position correction value is calculated, the processor 104 may control the lithography apparatus 106 to perform the lithography process on the wafers according to the feedforward position correction value. In this way, the lithography apparatus 106 is controlled to perform the lithography process according to the feedforward position correction value obtained by calculating the difference between the alignment mark position errors of the first wafer group and the reference error value, instead of directly performing the lithography process according to the measured alignment mark position errors as in the conventional technology, which may effectively reduce APC noises caused by differences (such as a difference in wafer chucks) in the device performance or structure between the measurement apparatus 102 and the lithography apparatus 106, and may improve overlay error control to enhance a yield rate and productivity of a semiconductor manufacturing process. The feedforward position correction value may also be represented as the model formula formed by the polynomials. That is, each of the coefficients of each of the alignment mark position errors of the wafers in the first wafer group may be subtracted from the corresponding coefficient in the model formula indicating the reference error value, and each of the subtracted coefficients is used as the coefficient of the model formula formed by the polynomials, so as to obtain the feedforward position correction value represented by the model formula formed by the polynomials.

Figure 4:
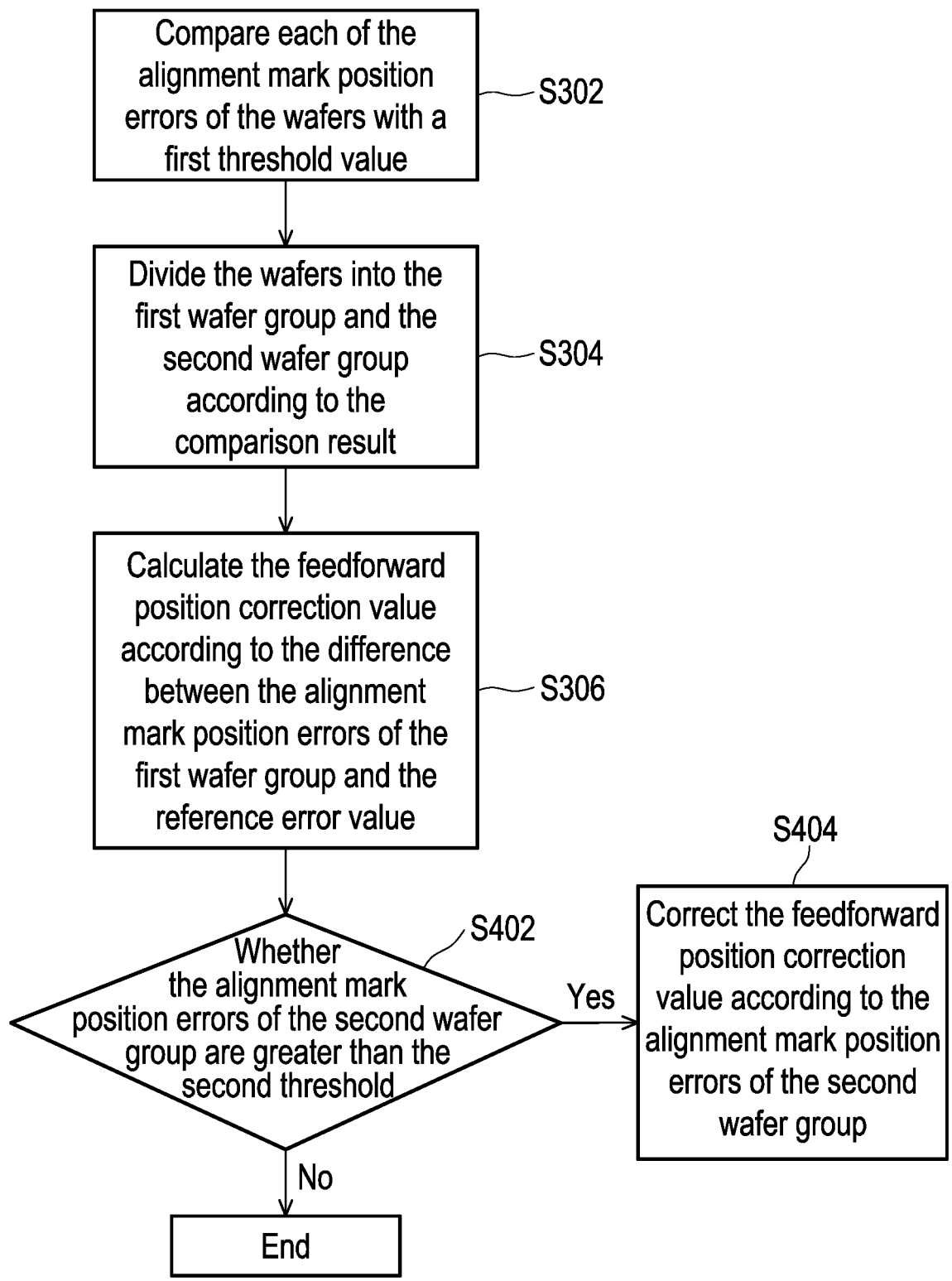
FIG. 4 is a flowchart of a method for generating a feedforward position correction value according to another embodiment of the disclosure.

FIG. 4 is a flowchart of a method for generating a feedforward position correction value according to another embodiment of the disclosure. In this embodiment, after step S306, the processor 104 may further compare the alignment mark position errors of the second wafer group with a second threshold value (step S402), and a way in which the alignment mark position errors of the second wafer group are compared with the second threshold value is similar to a way in which the alignment mark position errors of the first wafer group are compared with the first threshold value. Therefore, the same details will not be repeated in the following. If the alignment mark position errors of the second wafer group are not greater than the second threshold value, the steps proceeds with the end step. If the alignment mark position errors of the second wafer group are greater than the second threshold value, the feedforward position correction value may be corrected according to the alignment mark position errors of the second wafer group (step S404). For example, each of coefficients of the feedforward position correction value calculated in step S306 may be subtracted from the corresponding coefficient in the model formula indicating the alignment mark position errors of the wafers in the second wafer group, and each of the subtracted coefficients is used as the coefficient of the model formula formed by the polynomials, so as to obtain the corrected feedforward position correction value represented by the model formula formed by the polynomials. The alignment mark position errors of the wafers in the second wafer group used to correct the feedforward position correction value may be, for example, the mean value of the alignment mark position errors of all the wafers in the second wafer group, but the disclosure is not limited thereto. The alignment mark position errors of the wafers in the second wafer group used to correct the feedforward position correction value may also be, for example, the median value of the alignment mark position errors of the wafers in the second wafer group.

Figure 5:
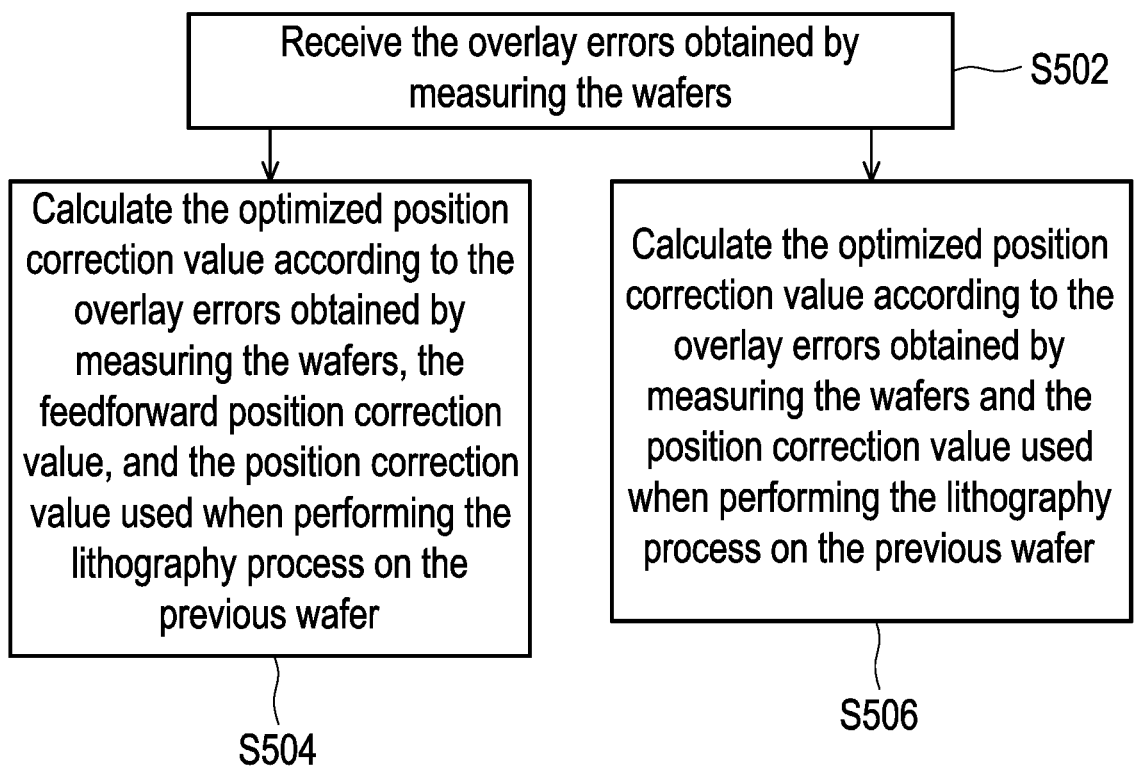
FIG. 5 is a flowchart of a method for generating an optimized position correction value according to an embodiment of the disclosure.

FIG. 5 is a flowchart of a method for generating an optimized position correction value according to an embodiment of the disclosure. Further, implementation details of step S210 may be as shown in FIG. 5, for example. The processor 104 may receive the overlay errors obtained by the overlay measurement apparatus 108 measuring the wafers (step S502). The model formula used in calculating the overlay errors may also be similar to, for example, the model formula used in calculating the alignment mark position errors, and the model formula formed by the polynomials is used to perform the approximate calculation. Therefore, the same details will not be repeated in the following. The processor 104 may calculate the optimized position correction value according to the overlay errors obtained by the overlay measurement apparatus 108 measuring the wafers, the feedforward position correction value calculated by the processor 104, and a position correction value used by the lithography apparatus 106 when performing the lithography process on the previous wafer (step S504). For example, assuming that the current wafer to be subjected to the lithography process is the Nth wafer, the position correction value used by the lithography apparatus 106 when performing the lithography process on the previous wafer is the optimized position correction value used when performing the lithography process on the N–1th wafer. The processor 104 may subtract the position correction value used by the lithography apparatus 106 when performing the lithography process on the N–1th wafer from the feedforward position correction value of the Nth wafer provided by the measurement apparatus 102 and the overlay error obtained by the overlay measurement apparatus 108 measuring the N–1th wafer, so as to obtain the optimized position correction value of the current Nth wafer to be subjected to the lithography process. In this way, the feedforward position correction value may be prevented from affecting the optimized position correction value of the next wafer. The optimized position correction value may also be represented as the model formula formed by the polynomials, for example.

In addition, in a case where the feedforward position correction value is not used when performing the lithography process on the previous wafer, the processor 104 may calculate the optimized position correction value according to the overlay errors obtained by the overlay measurement apparatus 108 measuring the wafers and the position correction value used by the lithography apparatus 106 when performing the lithography process on the previous wafer (step S506). For example, the position correction value used by the lithography apparatus 106 when performing the lithography process on the N–1th wafer is subtracted from the overlay error obtained by the overlay measurement apparatus 108 measuring the N–1th wafer, so as to obtain the optimized position correction value of the current Nth wafer to be subjected to the lithography process.

Based on the above, in the embodiments of the disclosure, the alignment mark positions of the wafers may be measured; the wafers are grouped into the first wafer group and the second wafer group according to the alignment mark position errors of the wafers and the first threshold value; the feedforward position correction value is calculated according to the difference between the alignment mark position errors of the first wafer group and the reference error value, and the lithography apparatus is controlled to perform the lithography process according to the feedforward position correction value. In this way, the lithography apparatus is controlled to perform the lithography process according to the feedforward position correction value obtained by calculating the difference between the alignment mark position errors of the first wafer group and the reference error value, instead of directly performing the lithography process according to the measured alignment mark position errors as in the conventional technology, which may effectively reduce the APC noises caused by the differences in the device performance or structure between the measurement apparatus and the lithography apparatus, and may improve the overlay error control to enhance the yield rate and productivity of the semiconductor manufacturing process.

What is claimed is:

1. A semiconductor manufacturing apparatus, comprising:
a lithography apparatus;
a measurement apparatus measuring alignment mark position errors of a plurality of wafers; and a processor coupled to the lithography apparatus and the measurement apparatus, grouping the wafers into a first wafer group and a second wafer group according to the alignment mark position errors of the wafers and a first threshold value, calculating a feedforward position correction value according to a difference between the alignment mark position errors of the first wafer group and a reference error value, and controlling the lithography apparatus to perform a lithography process according to the feedforward position correction value, wherein the alignment mark position errors of the first wafer group are greater than the first threshold value, and the alignment mark position errors of the second wafer group are less than or equal to the first threshold value.

2. The semiconductor manufacturing apparatus according to claim 1, wherein the processor calculates the reference error value according to the alignment mark position errors of the second wafer group.

3. The semiconductor manufacturing apparatus according to claim 2, wherein when the alignment mark position errors of the second wafer group are greater than a second threshold value, the processor corrects the feedforward position correction value according to the alignment mark position errors of the second wafer group.

4. The semiconductor manufacturing apparatus according to claim 1, wherein the reference error value is obtained according to historical alignment mark position errors of the wafers with the alignment mark position errors less than or equal to the first threshold value in the previous lot of wafers.

5. The semiconductor manufacturing apparatus according to claim 1, further comprising:
an overlay measurement apparatus coupled to the processor, wherein the overlay measurement apparatus measures overlay errors of the wafers, and the processor calculates an optimized position correction value according to the overlay errors of the wafers, the feedforward position correction value, and a position correction value used by the lithography apparatus when performing the lithography process on the previous wafer, and controls the lithography apparatus to perform the lithography process according to the optimized position correction value.

6. The semiconductor manufacturing apparatus according to claim 1, further comprising:
an overlay measurement apparatus coupled to the processor, wherein the overlay measurement apparatus measures overlay errors of the wafers, and the processor calculates an optimized position correction value according to the overlay errors of the wafers and a position correction value used by the lithography apparatus when performing the lithography process on the previous wafer, and controls the lithography apparatus to perform the lithography process according to the optimized position correction value.

7. A semiconductor manufacturing method of a semiconductor manufacturing apparatus, comprising:
measuring alignment mark position errors of a plurality of wafers;
grouping the wafers into a first wafer group and a second wafer group according to the alignment mark position errors of the wafers and a first threshold value, wherein the alignment mark position errors of the first wafer group are greater than the first threshold value, and the alignment mark position errors of the second wafer group are less than or equal to the first threshold value;
calculating a feedforward position correction value according to a difference between the alignment mark position errors of the first wafer group and a reference error value; and
performing a lithography process according to the feedforward position correction value.

8. The semiconductor manufacturing method of the semiconductor manufacturing apparatus according to claim 7, comprising:
calculating the reference error value according to the alignment mark position errors of the second wafer group.

9. The semiconductor manufacturing method of the semiconductor manufacturing apparatus according to claim 8, comprising:
correcting the feedforward position correction value according to the alignment mark position errors of the second wafer group when the alignment mark position errors of the second wafer group are greater than a second threshold value.

10. The semiconductor manufacturing method of the semiconductor manufacturing apparatus according to claim 7, wherein the reference error value is obtained according to historical alignment mark position errors of the wafers with the alignment mark position errors less than or equal to the first threshold value in the previous lot of wafers.

11. The semiconductor manufacturing method of the semiconductor manufacturing apparatus according to claim 7, comprising:
measuring overlay errors of the wafers;
calculating an optimized position correction value according to the overlay errors of the wafers, the feedforward position correction value, and a position correction value used when performing the lithography process on the previous wafer; and
performing the lithography process according to the optimized position correction value.

12. The semiconductor manufacturing method of the semiconductor manufacturing apparatus according to claim 7, comprising:
measuring overlay errors of the wafers;
calculating an optimized position correction value according to the overlay errors of the wafers and a position correction value used when performing the lithography process on the previous wafer; and
performing the lithography process according to the optimized position correction value.

* * * * *